United States Patent [19]

Kaley

[11] 4,376,562
[45] Mar. 15, 1983

[54] CAM ACTUATED SOCKET FOR ELECTRICAL LEADS

[75] Inventor: Robert C. Kaley, Landisville, Pa.
[73] Assignee: AMP Incorporated, Harrisburg, Pa.
[21] Appl. No.: 226,264
[22] Filed: Jan. 19, 1981
[51] Int. Cl.³ .................................................. H01R 13/639
[52] U.S. Cl. ................................ 339/75 M; 339/17 CF
[58] Field of Search ............ 339/17 CF, 75 R, 75 M; 174/52 FP

[56] References Cited
U.S. PATENT DOCUMENTS

| | | | |
|---|---|---|---|
| 3,753,211 | 8/1973 | Pauza et al. ................ | 339/17 CF |
| 3,877,064 | 4/1975 | Scheingold et al. .......... | 357/74 |
| 3,910,664 | 10/1975 | Pauza et al. ................ | 339/17 |
| 3,940,786 | 2/1976 | Scheingold et al. .......... | 357/74 |
| 4,052,118 | 10/1977 | Scheingold et al. .......... | 339/17 |
| 4,189,199 | 2/1980 | Grau ........................ | 339/17 CF |
| 4,220,383 | 9/1980 | Scheingold et al. .......... | 339/17 |
| 4,266,840 | 5/1981 | Seidler ..................... | 339/75 M |

Primary Examiner—John McQuade
Attorney, Agent, or Firm—Gerald K. Kita

[57] ABSTRACT

A strip socket for DIP leads has electrical terminals for direct mounting of the leads in a PCB. The socket has a strap which clamps securely to the DIP device and simultaneously cams the electrical terminals of the socket into electrical engagement with the DIP leads.

6 Claims, 9 Drawing Figures

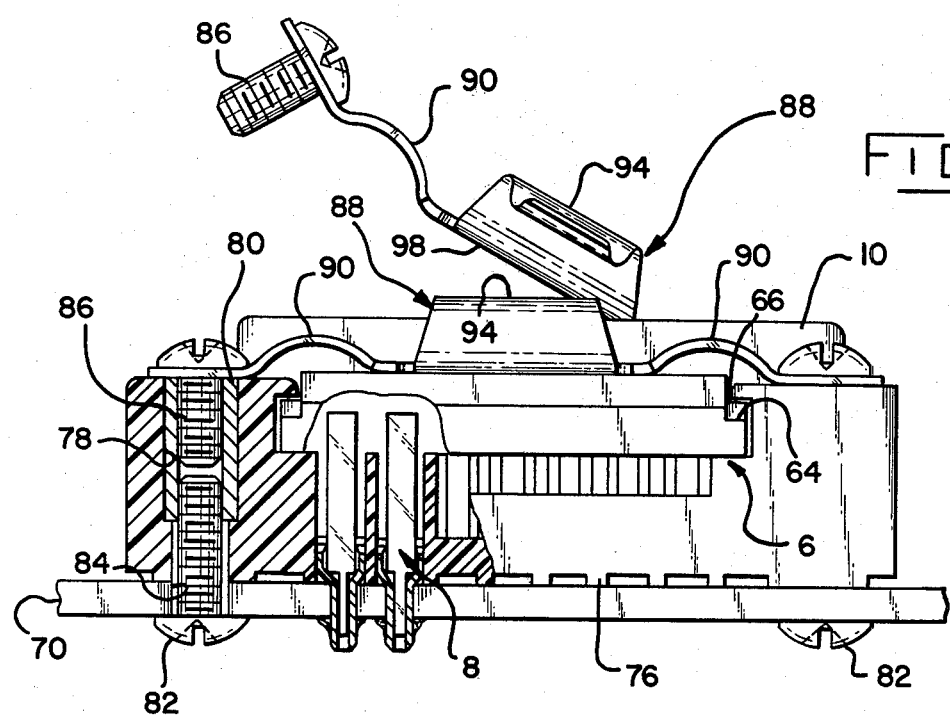
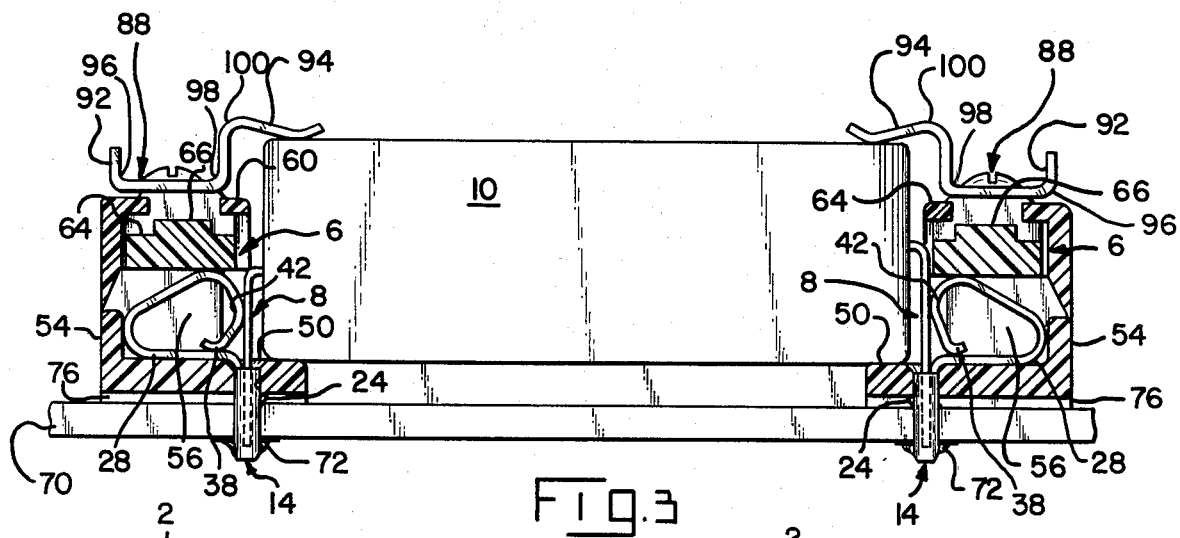
Fig.2
Fig.3
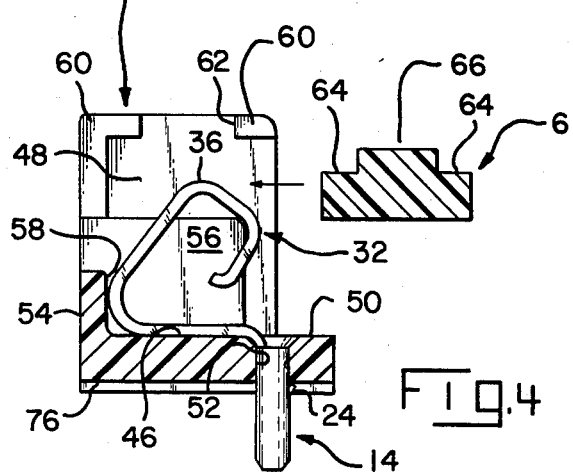
Fig.4
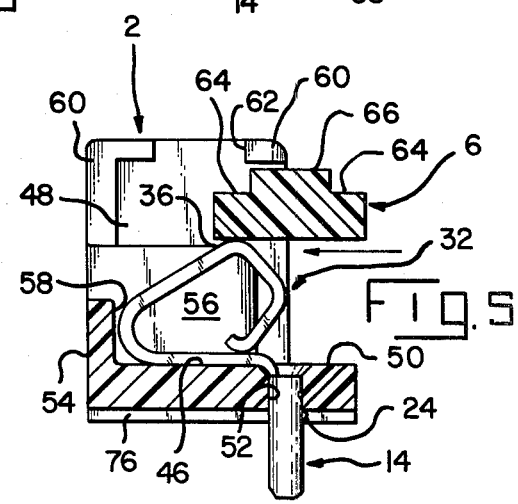
Fig.5

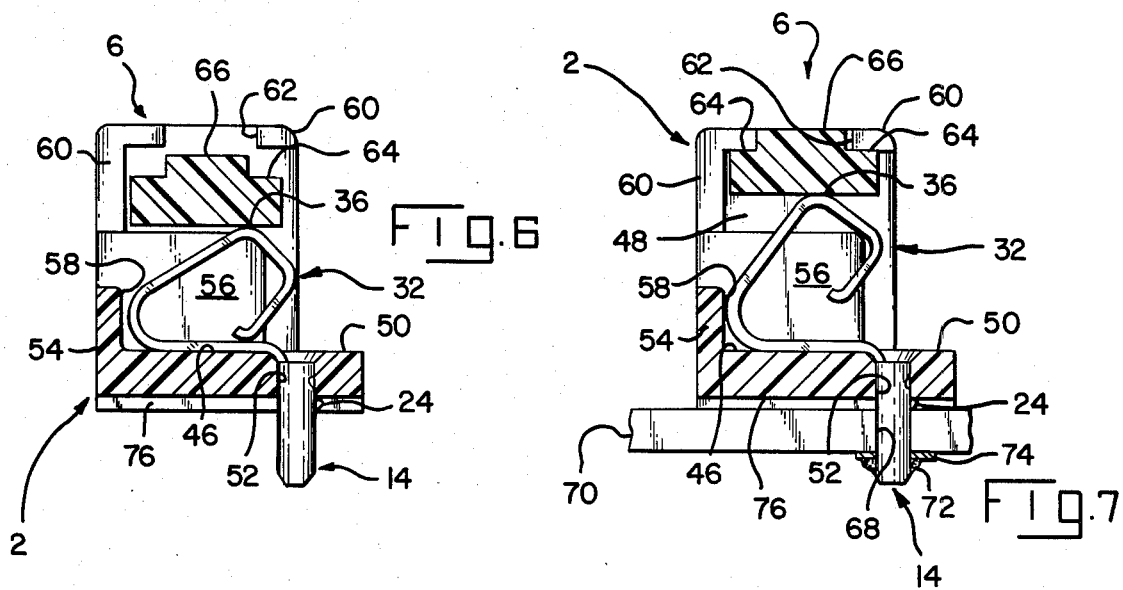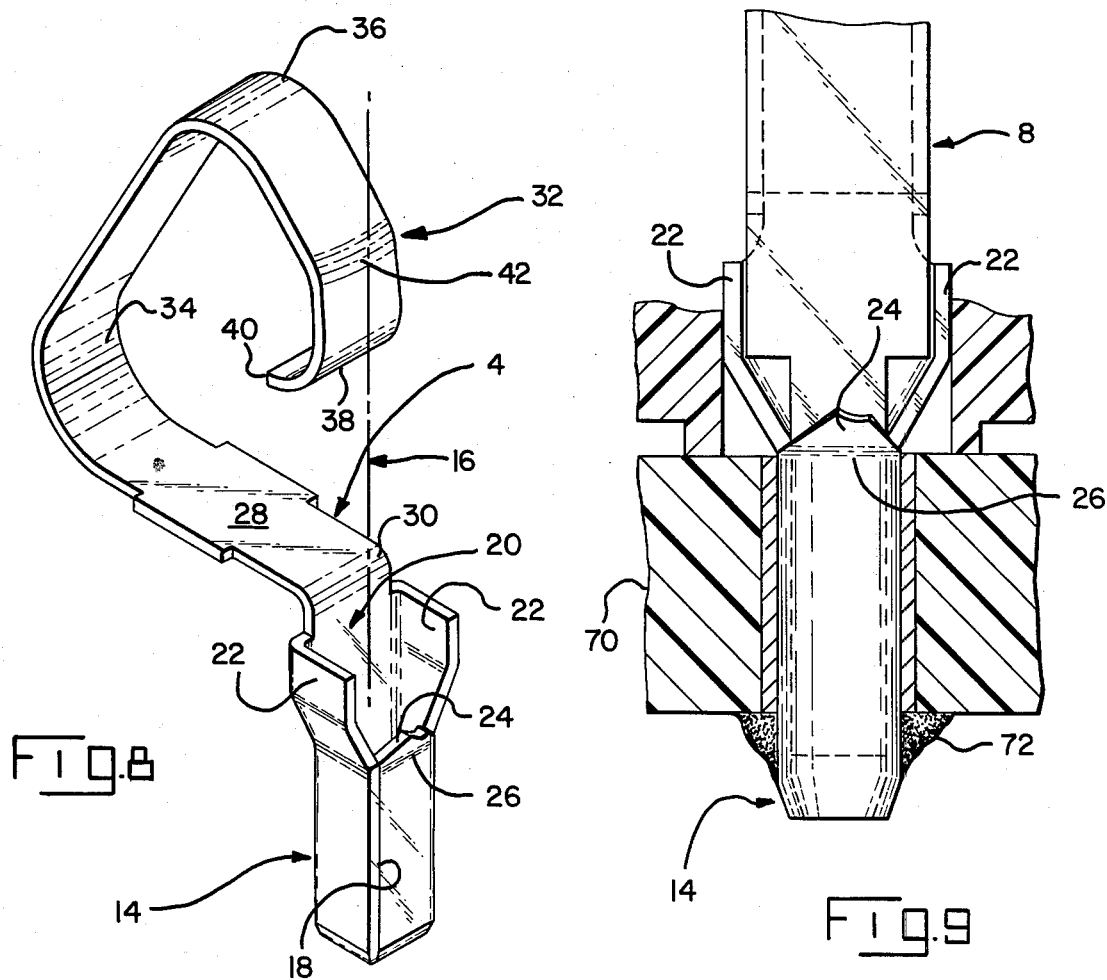

CAM ACTUATED SOCKET FOR ELECTRICAL LEADS

FIELD OF THE INVENTION

The present invention relates to electrical sockets for mounting a dual in line package (DIP) device removably to circuits on a printed circuit board (PCB).

BACKGROUND OF THE INVENTION

A DIP device includes integrated circuitry packaged within a rigid, insulative encapsulant. Within the encapsulant the circuitry is connected to conductive metal fingers which project outwardly from opposite sides of the encapsulant. The fingers are folded downwardly to provide pluggable electrical leads. The leads are arranged in dual, in-line rows. Hence the name "dual in line package" (DIP).

In U.S. Pat. No. 3,696,323, issued Oct. 3, 1972, a DIP header mounts the leads of a DIP device above a circuit board. Electrical terminals of the header resiliently engage the DIP leads and have depending electrical lead portions which plug into a PCB on which the header is mounted.

U.S. Pat. No. 3,622,950, issued Nov. 23, 1971, discloses a DIP header using a nonconductive rod to cam a moveable wall portion of the header against the DIP leads. The DIP leads are mounted in the header above the surface of a PCB.

U.S. Pat. No. 3,487,350, issued Dec. 30, 1969, discloses a DIP header having electrical receptacle contacts which plug into apertures of a PCB, and which contain metal spring sockets, that resiliently engage DIP leads and allow the DIP leads to plug directly into the PCB apertures.

There has been a need for a DIP socket of low profile, i.e., height above the surface of a PCB. The socket also should be of a zero insertion force (ZIF) type, i.e., a socket into which DIP leads are plugged with zero or, at least, low insertion force. Such a socket also should provide for positive retention of a DIP device and require minimum space on a PCB for actuation of any moveable parts.

SUMMARY OF THE INVENTION

In a socket of the present invention, the electrical terminals have receptacle portions which pluggably receive respective DIP leads. Resilient spring contact portions of the terminals initially are disengaged from the DIP leads to allow for easy insertion of the leads into the receptacles. The contact portions then are deflected toward and against the DIP leads to establish electrical connections therewith. The socket has a clamping strap which securely clamps to the DIP device, and serves as an actuator for a cam which deflects the contact portions against the DIP leads. The socket does not consume additional PCB surface for actuation of the cam. The terminals of the socket permit mounting of the DIP leads into the thickness of the PCB to provide a socket mounting of low profile, i.e., low height above the surface of the PCB.

OBJECTS

An object of the present invention is to provide a DIP socket having a clamping strap which clamps onto a DIP device, and which is an actuator for a cam that deflects electrical terminals of the socket into engagement with the DIP leads.

Another object is to provide a socket that plugs the leads of a DIP device into a PCB, thereby to provide a low profile, DIP socket mounting.

Another object is to provide a DIP socket, which plugs the leads of a DIP device into a PCB to provide a low profile, DIP socket mounting, and which has cam actuated terminals which are deflected into engagement with pluggably mounted DIP leads.

Another object is to provide a DIP socket of strip form which is constructed for mounting one row of DIP leads into apertures of a PCB.

Other objects and advantages of the present invention will become apparent from the following detailed description taken in conjunction with the drawings.

DESCRIPTION OF THE DRAWINGS

FIGS. 2 and 3 are elevations in section of the assembled parts shown in FIG. 1.

FIGS. 4–7 are fragmentary enlarged cross sections of one socket illustrating assembly thereof and cam actuation of electrical terminals carried by the socket.

FIG. 8 is an enlarged perspective of an electrical terminal portion of the socket.

FIG. 9 is a fragmentary enlarged section of a portion of FIG. 2.

DETAILED DESCRIPTION

Figure 1:
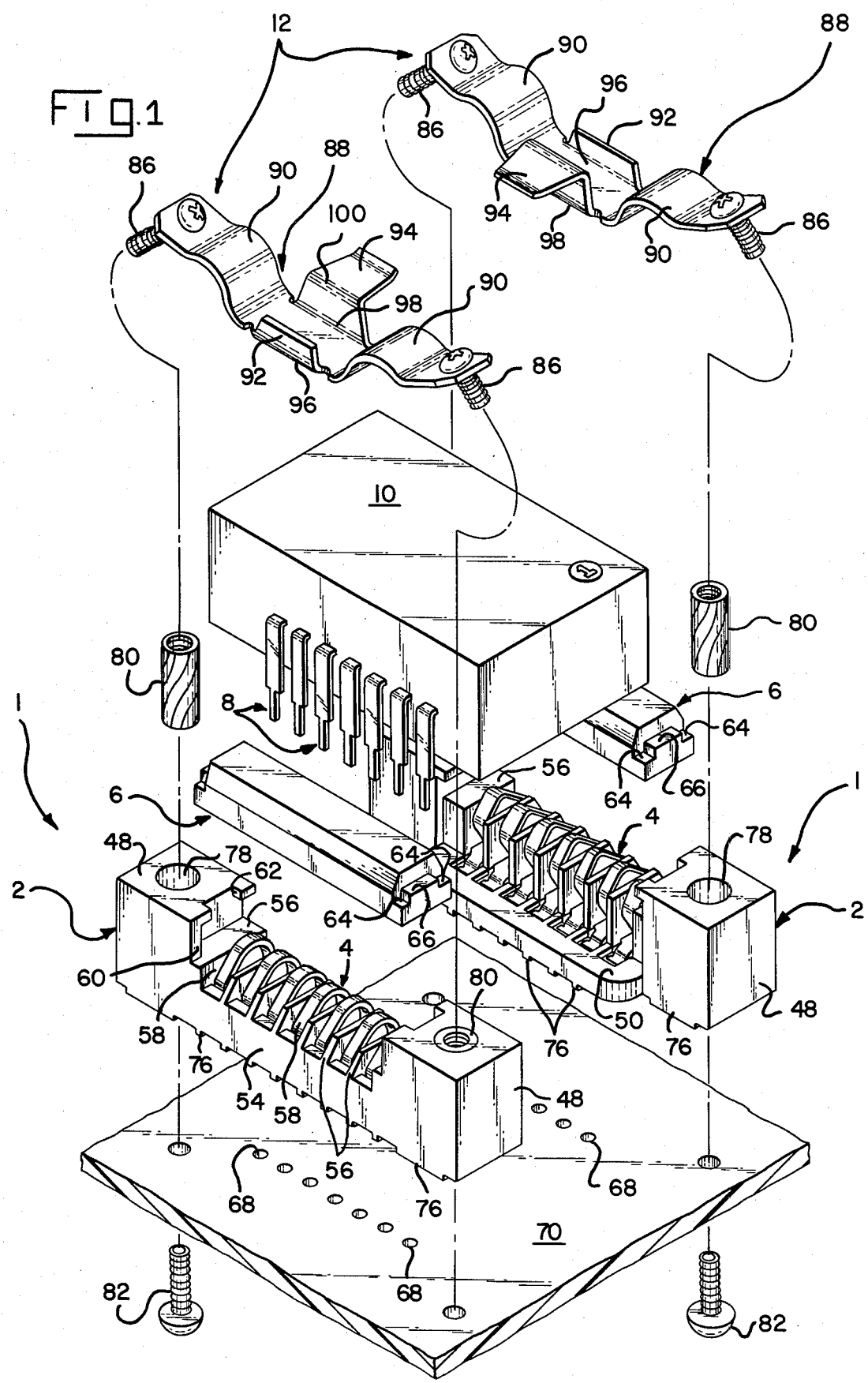
FIG. 1 is a perspective of a preferred embodiment of a pair of sockets with parts exploded, together with a DIP device and a portion of a circuit board.

With more specific reference to the drawings, FIG. 1 shows a pair of sockets, generally at 1, each comprising a base 2, which mounts a plurality of electrical terminals 4 in a row, a moveable cam 6, which cams the terminals into engagement with electrical DIP leads 8 of a DIP package 10, and a strap 12, which is secured to the respective base 2, for clamping the DIP package 10 and for actuating a respective cam 6 in a manner to be described.

FIG. 8 shows the details of each terminal 4, made by stamping and forming a unitary flat metal blank or strip. For example, a layout for a receptacle portion 14 of the terminal is stamped in the flat metal, and then is folded about a central axis 16 to form a four sided, elongated box having a longitudinal seam 18 and an open end 20, two sides 22 of which are flared to provide a funnel shape. A third side of the open end 20 is integral with the remainder of the terminal 4. The fourth side of the open end 18 also is open and is directly above a pointed barb 24 that projects outward laterally of the axis 16 and is on an outwardly flared lip 26 of the receptacle portion 14.

A planar base portion 28 of the terminal transverse to the axis 16 is joined to the receptacle by a fold 30. The base portion is integral with an elongated leaf spring contact portion 32 which has a first recurved portion extending upwardly at 34 from the base portion, a second recurved portion 36 and a third recurved portion 38 adjacent its free end 40. Adjacent to the recurved portion 38, the spring contact portion 32 is provided with a curved contact surface 42 extending transversely across the contact portion 32.

FIGS. 1 and 4 show each base 2, of unitary molded plastic construction, including a bottom wall 46 and a spaced apart pair of thickened end walls 48. The bottom wall has a projecting ledge portion 50 provided with a series of molded openings 52 therethrough which receive and conform to the peripheries of receptacle portions 14 of respective terminals. The barbs 24 latch against the plastic material to retain the receptacles in place. Each base 2 further includes a sidewall 54 projecting along the bottom wall 46 and connected between the ends walls 48. The base 2 also includes a series of molded, partition walls 56 spaced apart between the end walls 48, and connecting the side wall 54 and bottom wall 46. The partition walls 56 define therebetween receiving cavities 58 separating spring contact portions 32. The recurved portions 36 project initially above the top surfaces of the partition walls 56 but below the top surfaces of the end walls 48. FIGS. 1 and 4 show each end wall 48 provided with a lip flange 60 interrupted by a vertical, slotted keyway 62. Each cam 6 is of unitary molded plastic construction and comprises an elongated bar having a flat bottom surface and a flat top surface of reduced length. Each end of the cam is of inverted T-shape including projecting stop walls 64 on either side of a projecting key 66.

FIGS. 4-6 illustrate an exemplary one of the cams 6 on a respective base 2. The cam section is in a different plane from the base section to enable the various relative positions of the cam and key way to be seen clearly. Each cam 6 is inserted into a space, defined between a respective pair of end walls 48 and over the top surfaces of the partition walls 56. As shown in FIG. 5, insertion of the cam is accomplished by resiliently deflecting the contact portions 32 toward the base bottom wall 46 to provide adequate clearance for passing the keys 66 of the cam under respective flanges 60. Upon alignment of the cam 6 as shown in FIG. 6, the original shapes of the contact portions 32 are restored by expending their spring energy which became stored by the aforesaid resilient deflection thereof. FIG. 7 shows the restored spring portions 32 engaging and holding the cam 6 away from the top surfaces of the partition walls 56, and urging the keys 66 into registration within the keyways 62. Further the stop walls 64 engage the undersurface of the flanges 60 and retain the cam 6.

Also shown in FIG. 7, and in conjunction with FIG. 1, the receptacle portions 14 depend from the bottom wall 46 and are pluggably inserted in apertures 68 of a PCB 70. Solder joints 72 connect the receptacle portions with conductive circuit pads 74 on the PCB. Protruding feet 76, molded on the bottom wall, support each base 2 on the PCB.

As shown in FIGS. 1 and 2, each end wall 48 is provided with a vertical bore 78 in which is secured a metal sleeve liner 80 which is internally threaded to receive threaded fasteners 82 which pass through apertures 84 in the PCB 70 to secure the respective bases 2 and prevent disturbance of the solder joints by movement of the bases. Additional threaded fasteners 86 are secured in the tops of the liners 80 to secure elongated straps 88.

Each strap 88 is stamped and formed from a single strip of metal having strong spring properties. Each end portion 90 is recurved and upwardly bowed with respect to the midportion thereof. The midportion is provided with tabs 92 and 94 projecting in opposite directions transverse to the length of the strap. Each of the tabs is partially folded along respective fold lines or axes 96, 98 and 100 projecting parallel to the length of the strap. The fold lines stiffen the tabs and the midlength of the strap to resist bending about any axis parallel to the length of the strap.

As illustrated in FIGS. 2 and 3, one strap 86 is shown with only one end portion 90 thereof secured by its fastener 86, so that the remainder of the strap is bowed outwardly away from the top surface of the respective cam 6. Initially the strap does not interfere with insertion of the DIP leads 8 into respective receptacles 14. Then, as shown in FIGS. 2 and 3, the strap bridges between end walls 48 of a respective base 2, to which the strap is then secured by its fasteners 86. By this process, the tab 94 is caused to overlie against the DIP device 10, clamping the body of the DIP device against a respective ledge 50. The end portions 90 of the strap are resiliently deflected toward respective end walls to store spring energy for generation and maintenance of clamping force on the DIP device 10. Further, the strap engages a respective cam 6, against which the generated clamping force is applied to urge the cam toward and against the top surfaces of the partition walls 56. The clamping force overcomes the resilient spring action of the spring contact portions 32, forcing them to deflect resiliently in directions toward and across the axes 16 of the receptacles 14, and to engage the DIP leads 8 which have been inserted into the receptacles. The controlled limit of deflection in the spring contacts is achieved once the cam 6 is seated on the partition walls 56.

The contact surface 42 is the primary contact surface to engage a DIP lead 8 and establish electrical connection therewith. The recurved portion 38 is cammed to contact the base portion 28 and establish an electrical path directly from the contact surface 42 to the base portion 28, which path is shorter than the length in an opposite direction the contact portion 32.

Although a preferred embodiment or embodiments are shown and described, other embodiments and modifications thereof, which would be obvious to one of ordinary skill, are intended to be covered by the spirit and scope of the appended claims.

What is claimed is:

1. A socket for DIP leads comprising:
   an insulative base provided with a seat for a DIP device and a series of partition walls,
   a row of electrical terminals mounted on said base separated from one another by said partition walls, said terminals having resilient, spring contact portions initially projecting above said partition walls, and receptacle portions depending from said base defining electrical leads,
   a pair of end walls on said base projecting above said partition walls,
   a cam extending between said end walls initially supported on said contact portions and outwardly away from said partition walls,
   said cam being constructed for displacement toward and registration against said partition walls deflecting resiliently said central portions in directions across the axes of respective said receptacle portions, and
   means secured on said base for actuating said cam toward and against said partition walls and for defining between said means and said seat a receiving space for a DIP device.

2. The structure as recited in claim 1, wherein, said means comprises a strap secured to one said end walls and constructed for removable fastening to another of said end walls.

3. The structure as recited in claim 2, wherein, said strap is fabricated from resiliently deflectable material.

4. The structure as recited in claim 1, wherein, said means comprises an elongated strap having a first resiliently deflectable end portion secured to one of said end walls, a second resiliently deflectable end portion secured removably to another of said end walls and a midportion formed with oppositely projecting tab portions each bent along a respective axis projecting lengthwise of said strap.

5. The structure as recited in claim 1, wherein, each said receptacle portion includes an open end communicating with said receiving space, and said seat is aligned with said open ends of said receptacles.

6. The structure as recited in claim 1, wherein each said end wall is provided with a keyway and said cam includes a key slidably mounted along a respective said keyway.

* * * * *